United States Patent [19]

Gilfeather et al.

[11] Patent Number: 4,819,047
[45] Date of Patent: Apr. 4, 1989

[54] PROTECTION SYSTEM FOR CMOS INTEGRATED CIRCUITS

[75] Inventors: Glen Gilfeather; Joe W. Peterson, both of Austin, Tex.

[73] Assignee: Advanced Micro Devices, Inc., Sunnyvale, Calif.

[21] Appl. No.: 50,979

[22] Filed: May 15, 1987

[51] Int. Cl.$^4$ .................... H01L 29/78; H01L 27/02; H01L 27/10
[52] U.S. Cl. .............................. 357/23.13; 357/40; 357/42; 357/43; 357/44; 357/45; 357/51; 357/88; 361/56; 361/91
[58] Field of Search ............ 357/45, 45 M, 40, 23.13, 357/44, 51, 88, 42, 43; 361/56, 58, 91

[56] References Cited

U.S. PATENT DOCUMENTS

| | | | |
|---|---|---|---|
| 4,412,237 | 10/1983 | Maksumura et al. | 357/42 |
| 4,453,174 | 6/1984 | Kawasaki et al. | 357/26 |
| 4,476,476 | 10/1984 | Yu et al. | 357/42 |
| 4,654,689 | 3/1987 | Fujii | 357/45 |
| 4,661,815 | 4/1987 | Takayama et al. | 357/45 |

FOREIGN PATENT DOCUMENTS

| | | | |
|---|---|---|---|
| 0055552 | 7/1982 | European Pat. Off. | 357/23.13 |
| 55-165682 | 12/1980 | Japan | 357/23.13 |
| 2113469 | 7/1983 | United Kingdom | 357/23.13 |

Primary Examiner—J. Carroll
Assistant Examiner—Ngan Van Ngo
Attorney, Agent, or Firm—Davis Chin

[57] ABSTRACT

A protection system for CMOS integrated circuits to prevent inadvertent damage caused by electrostatic discharge includes a low impedance power supply bus structure and a plurality of bipolar and MOS clamping networks. The bipolar clamping networks are formed around each of the bonding pads for interlinking all of them together through the low impedance power supply bus structure. When any one of the bonding pads receives a higher voltage than a predetermined value and another remaining one of the bonding pads contacts a ground potential, current is routed from the one bonding pad through the low impedance power supply bus structure to the other bonding pad in order to discharge the same.

6 Claims, 6 Drawing Sheets

PROTECTION SYSTEM FOR CMOS INTEGRATED CIRCUITS

CROSS-REFERENCES TO RELATED APPLICATIONS

This application is related to Ser. No. 008,703 filed on Jan. 29, 1987, entitled "Electro-Static Discharge Protection Device For CMOS Integrated Circuit Inputs," which is in turn a continuation-in-part of application Ser. No. 761,223 filed on July 31, 1985. The application Ser. No. 008,703 was filed in the names of the inventors Steven W. Longcor, Kuang-Yeh Chang, Jih-Chang Lien and David M. Rogers, and was assigned to the same assignee as the present application. This application Ser. No. 008,703 is hereby incorporated by reference.

BACKGROUND OF THE INVENTION

This invention relates generally to semiconductor integrated circuits and more particularly, it relates to a protection system for CMOS integrated circuits to prevent inadvertent damage caused by electrostatic discharge during manufacturing and throughout its product life.

It is generally known that the magnitude of an electric voltage allowed to be applied to an integrated circuit package is rather limited since the physical size of the integrated circuit package is fairly small. When the integrated circuit package is not being used, for example, in storage or handling, the external leads or pins thereof are susceptible to the build-up of a static charge thereon. If the integrated circuit package happens to come in contact with a ground potential, the accumulated static charges will flow to ground. Such static discharge can be of a catastrophic nature with sufficient energy to cause damage or even destroy the semiconductor element or chip mounted within the integrated circuit package.

In order to protect the semiconductor chip in the integrated circuit package from being destroyed when such static discharges occur, there has been provided in the prior art a protection element such as a p-n junction applied with a reverse bias, which breaks down when the semiconductor chip encounters an unexpectedly high voltage. However, these protection devices were only provided between either the input or output pins and a power supply pin. Thus, in such protection devices, the charges accumulated on either the input pins or output pins were discharged only when the power supply pin was made to come in contact with the ground potential. Accordingly, the prior art protection devices offered no protection when another input pin or output pin was the one referenced to ground. Also, no discharge path was provided for when the accumulated charges were applied on a power supply pin.

In actual practice, the build-up of such electrostatic charges could be applied on any one of the plurality of external pins of the integrated circuit package which typically has as many as forty leads. The discharging occurs when any one of the remaining pins comes into contact with the grounded potential. As a consequence, the discharging could occur, in essence, between any one of the pins and any one of the other remaining pins. As used herein, the pin on which the electrostatic charges are applied is referred to as the "pin zapped", and the pin coming into contact with the grounded potential is referred to as the "pin grounded".

It would therefore be desirable to provide a protection system for CMOS integrated circuits to prevent inadvertent damage caused by electrostatic discharge occurring between any pin and any other pin of the integrated circuit package. This is achieved in the present invention by the provision of low impedance parasitic clamps connected to each of the bonding pads which are connectible to external pins and a low impedance bus structure interlinking all of the clamps together.

SUMMARY OF THE INVENTION

Accordingly, it is a general object of the present invention to provide an improved protection system for CMOS integrated circuits to prevent inadvertent damage caused by electrostatic discharge which is relatively simply and economical to manufacture and assemble, but yet overcomes the disadvantages of the prior art protection devices.

It is an object of the present invention to provide a protection system for CMOS integrated circuits to prevent inadvertent damage caused by electrostatic discharge occurring between any bonding pad and any other bonding pad of the semiconductor integrated circuit.

It is another object of the present invention to provide a protection system for CMOS integrated circuits which includes low impedance parasitic clamps connected to each of the bonding pads and a low impedance power bus structure interlinking all of the clamps together.

It is still another object of the present invention to provide a protection system for CMOS integrated circuits which includes low impedance parasitic clamps coupled to each of the external pins of the integrated circuit package so as to discharge a high voltage from the pin zapped through a low impedance power bus structure to the pin grounded, thereby avoiding damage to the semiconductor chip.

In accordance with these aims and objectives, the present invention is concerned with the provision of a protection system for CMOS integrated circuits to prevent inadvertent damage caused by an electrostatic discharge which includes a semiconductor body of a generally rectangular shape. A first annular conductive layer is disposed on the semiconductor body to surround the central portion thereof. A second annular conductive layer is disposed concentrically with the first annular conductive layer in a spaced apart relationship and adjacent the edges of the semiconductor body to form an area therebetween. The first and second annular conductive layers define low impedance pathways. A plurality of bonding pads consisting of input pads, output pads, first power supply pads and second power supply pads are disposed within the area between the first and second conductive layers. First power supply clamps are used to couple each of the first power supply pads to the first conductive layer. Second power supply clamps are used to couple each of the second power supply pads to the second conductive layer.

Input clamps are provided for coupling each of the input bonding pads to internal circuit elements formed within the central portion of the semiconductor body. Output clamps are provided for coupling each of the output bonding pads to the internal circuit elements.

One of the input clamps becomes activated when its corresponding input bonding pad receives a voltage higher than a predetermined value. One of the output clamps becomes activated when its corresponding output bonding pad comes into contact with a ground potential. As a result, the voltage is converted to a current and is then routed from the input bonding pad via the low impedance pathways to the output bonding pad for discharging of the voltage.

BRIEF DESCRIPTION OF THE DRAWINGS

These and other objects and advantages of the present invention will become more fully apparent from the following detailed description when read in conjunction with the accompanying drawings with like referenced numerals indicating corresponding parts throughout, wherein.

DESCRIPTION OF THE PREFERRED EMBODIMENT

Figure 1:
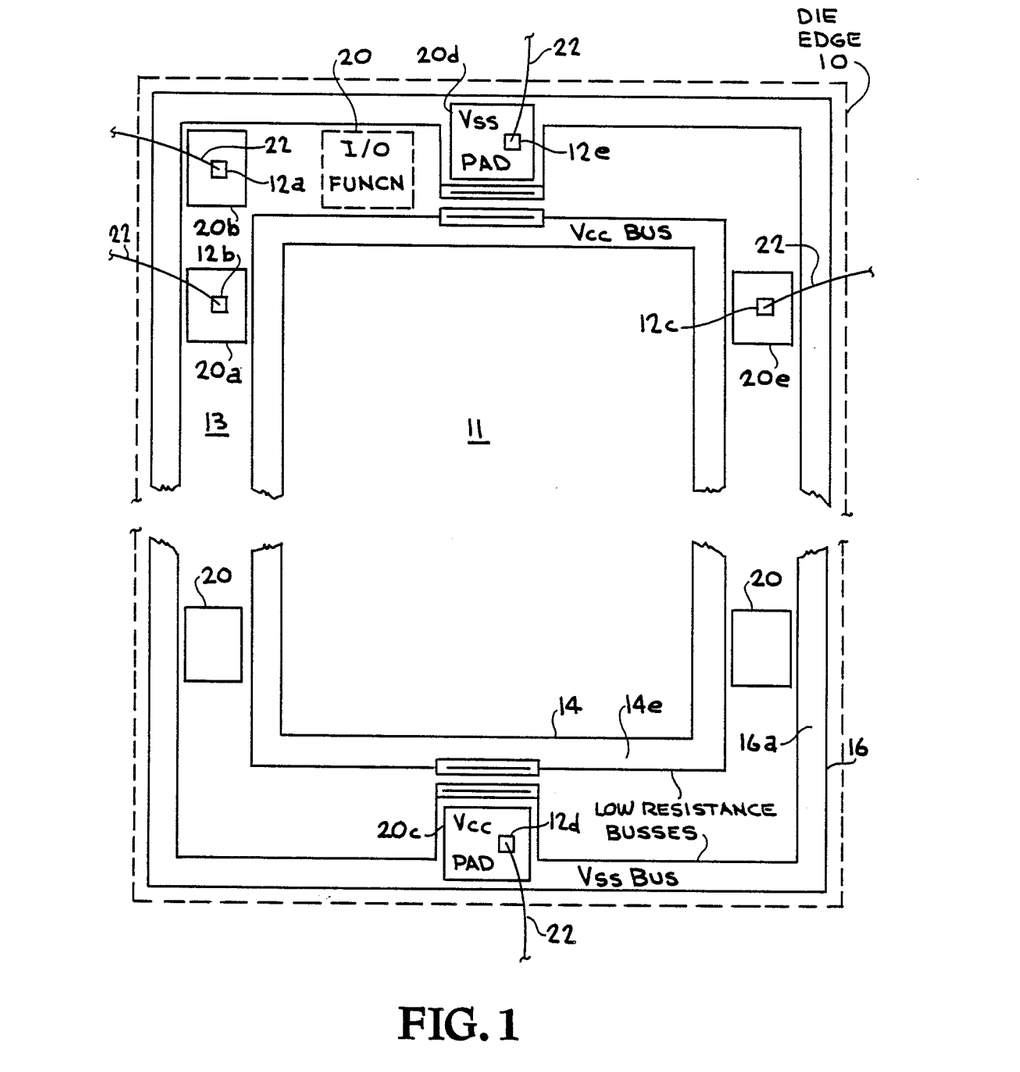
FIG. 1 is a top plan view of a CMOS integrated circuit chip having a protection system, constructed in accordance with the principles of the present invention.

Referring now in detail to the drawings, there is shown in FIG. 1 a top plan view of a complementary metal-oxide semiconductor integrated circuit chip or die 10 referred to hereinafter as a "CMOS IC" element, which includes a protection system constructed in accordance with the principles of the present invention. The protection system is used to prevent inadvertent damage caused by electrostatic discharge encountered during the manufacturing process and throughout the life of the product. The CMOS IC element or chip 10 has a generally rectangular-shaped semiconductor body of, for example, silicon and a large number of active and passive circuit elements (not shown) formed in its central portion 11. In order to supply signals that are to be processed to the chip and to obtain the processed signals from the chip, the chip 10 is provided with a large number of signal bonding pads 12 which are disposed near the periphery of the four sides. These signal bonding pads may consist of any combination of input bonding pads 12a, output bonding pads 12b, and input-output (I/O) bonding pads 12c which are electrically connected to the circuit elements contained in the central portion of the chip 10. Further, some of these bonding pads in the chip 10 are to be supplied with a first power supply voltage VCC and are referred to as a VCC bonding pad 12d. Also, some of these pads are supplied with a second power supply voltage VSS and are referred to as a VSS bonding pad 12e.

The chip 10 is conventionally mounted within a package (not shown) provided with a plurality of external leads or pins, such as in a DIP (Dual In-Line Package) type or in a SIP (Single In-Line Package) type, and a hermetically sealing metal lid or a molded plastic package. In order to prevent the CMOS IC chip 10 from being damaged or destroyed when electrostatic charges are accumulated on any one of the plurality of external pins, the chip 10 of the present invention includes a protection system for interlinking all the bonding pads so that the surge on the external pin having the electrostatic charge (the pin zapped) will be routed immediately via low resistance pathways to the pin referenced to ground (the pin grounded). Since an electrostatic discharge event (i.e., high voltage, low current, short duration) endangers the thin oxide films in the CMOS IC element and a large power dissipation causes heat which damages the junctions formed therein, the protection system has been designed so a to convert the high voltage into a high current pulse which is caused to flow between the pin zapped and the pin grounded. In practice, this could be between any one of the plurality of external pins and any one of the other remaining pins.

The protection system includes a low impedance power supply bus structure and a plurality of bipolar and MOS clamping networks. The bus structure is formed of two concentric power supply bus rings 14 and 16. The VCC power supply bus ring 14 is formed of a metalized annular conductive layer 14a which is disposed on the semiconductor body. The conductive layer 14a serves as a low impedance pathway which surrounds the central portion 11 of the chip 10. The VSS power supply bus ring 16 also consists of a metalized annular conductive layer 16a which is disposed concentrically with the first conductive layer in a spaced apart relationship and adjacent the edges of the semiconductor body to form an area 13 therebetween. The conductive layer 16a serves as a low impedance pathway surrounding the peripheral portion of the chip 10. The plurality of clamping networks 20 are disposed in the area 13 between the first and second conductive layers 14a and 16a. It should be understood that the layers 14a and 16a may be reversed in some designs.

It will be noted that each of the clamping networks 20 are formed in a surrounding relationship with one of the corresponding signal bonding pads 12. The signal bonding pads 12 are connected to one end of bonding wires 22. The other ends of the bonding wires 22 are suitably connected to the external pins (not shown) of the integrated circuit package through connection terminals (not shown). In this manner, the external pins are coupled to the bonding pads 12. The clamp networks 20 are used to couple the corresponding bonding pads and thus their corresponding external pins to the internal circuit elements on the chip 10.

These clamp networks 20 function as transducers which convert the high voltage applied to the pin (bonding pad) zapped to a high current pulse. This current pulse will be sent through the low impedance pathways from the bonding pad zapped and its corresponding clamping network to the pin (bonding pad) grounded via its corresponding clamping network. As a result, the electrostatic charge is kept away from the central portion 11 of the chip containing the circuit elements by routing the high current around the bus structure and out the pin grounded, thereby preventing inadvertent damage to the chip. These clamping networks are fabricated from process parasitics and thus are not operative under normal conditions. The clamping networks 20 are designed so as to operate only when a voltage received at the bonding pads 12a–12e is higher than the normally allowable voltage. Typically, the ordinary semiconductor chip is made to work with a relatively low voltage, i.e., 5 volts. Therefore, the clamping network comes into play only when the voltage is somewhat higher than 5 volts.

Figure 2:
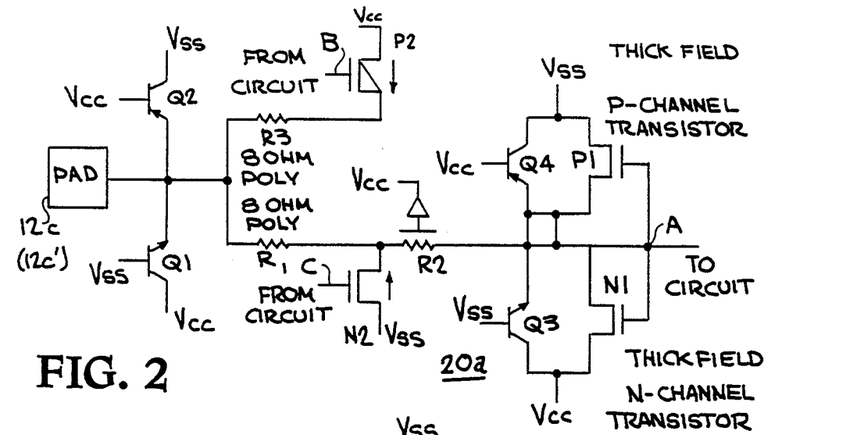
FIG. 2 is an equivalent circuit diagram of the input-/output clamp of FIG. 1.

The clamping networks 20 may consist of any combination of input/output (I/O) buffer protection circuits 20a, input buffer protection circuits 20b, VCC pad protection circuits 20c, and VSS pad protection circuits 20d. In FIG. 2, there is shown an equivalent circuit diagram of the I/O buffer protection circuit 20a of FIG. 1. The circuit 20a includes a primary clamp formed of a vertical bipolar NPN-type transistor Q1 and a lateral bipolar PNP-type transistor Q2. The transistor Q1 has its base coupled to the VSS power supply bus layer 16a, its emitter connected to the I/O bonding pad 12c, and its collector coupled to the VCC power supply bus layer 14a. The transistor Q2 has its base coupled to the VCC power supply bus layer 14a, its emitter connected to the I/O bonding pad 12c, and its collector coupled to the VSS power supply bus layer 16a.

A poly resistor R1 and a diffusion-type resistor R2 are connected in series between the bonding pad 12c and a node A which is connected to the internal circuit elements of the chip 10. The circuit 20a further includes secondary clamps formed of an NPN-type bipolar transistor Q3, a PNP-type bipolar transistor Q4, a thick N-channel field-effect transistor N1, and a thick P-channel field-effect transistor P1. The transistor Q3 has its base coupled to the VSS power supply bus layer 16a, its emitter connected to the node A, and its collector connected to the VCC power supply bus layer 14a. The transistor Q4 has its base coupled to the VCC power supply bus layer 14a, its emitter connected to the node A, and its collector coupled to the VSS power supply bus layer 16a. The transistor N1 has its drain coupled to the VCC power supply bus layer 14a and its gate and source connected to the node A. The transistor P1 has its source coupled to the VSS power supply bus layer 16a and its gate and drain connected to the node A. Thus, it can be seen that the secondary clamp is isolated from the high voltage developed on the pad 12c by the resistors R1 and R2.

Figure 6:
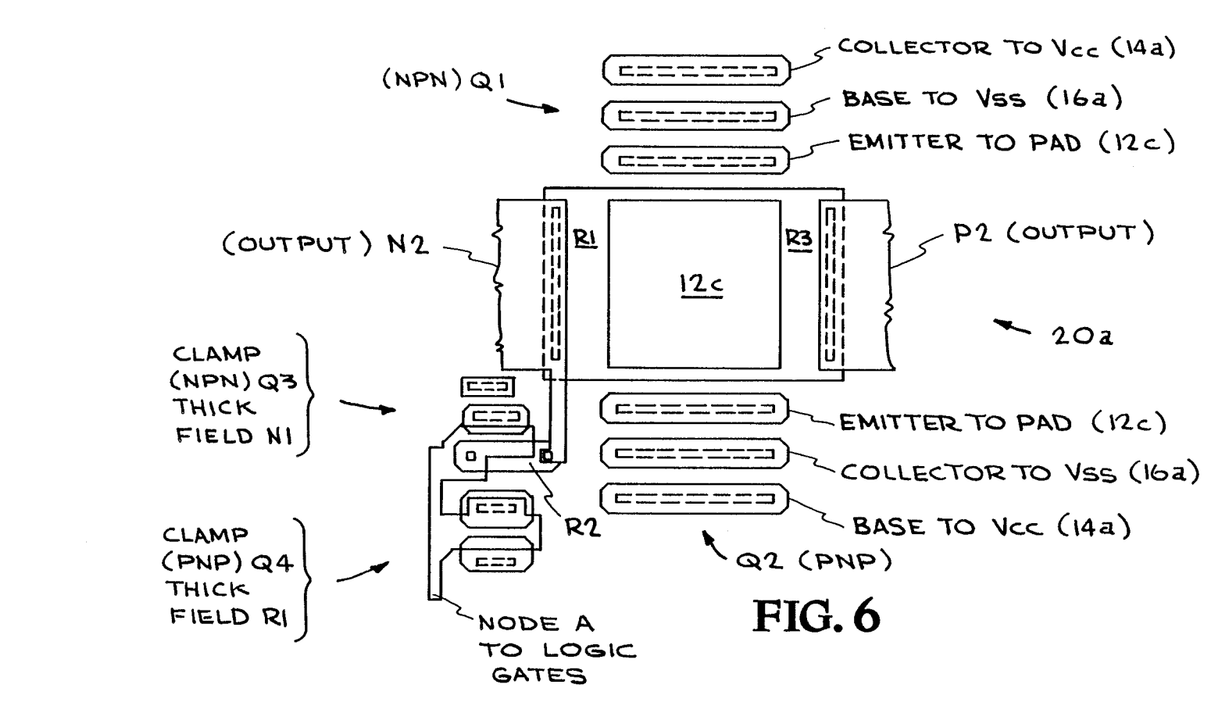
FIGS. 6-9 are plots of the corresponding clamps shown in FIGS. 2 through 5.

The circuit 20a includes a P-channel output driver transistor P2 and an N-channel output driver transistor N2. The transistor P2 has its source coupled to the VCC power supply bus, its gate at node B connected from the internal circuit elements, and its drain connected to the pad 12c via a poly resistor R3. The transistor N2 has its source coupled to the VSS power supply bus, its gate at node C connected from the internal circuit elements, and its drain connected to the pad 12c via the poly resistor R1. A plot of the clamp circuit 20a is shown in FIG. 6.

In operation, when the voltage at the pad 12c goes above the supply voltage VCC the transistor Q2 will be turned on so as to pass current through the VSS power supply bus layer 16a. While the transistor Q4 will also be turned on, most of the current will flow through the transistor Q2 due to the resistors R1 and R2. Thus, no current will be sent into the node A connected to the internal circuit elements. When the voltage at the pad 12c goes below the supply voltage VSS, the transistor Q1 will be turned on so as to pass current through the VCC power supply bus layer 14a. While the transistor Q3 will also be turned on, most of the current will flow through the transistor Q1 due to the resistors R1 and R2. Again, no current will be sent into the node A.

Figure 3:
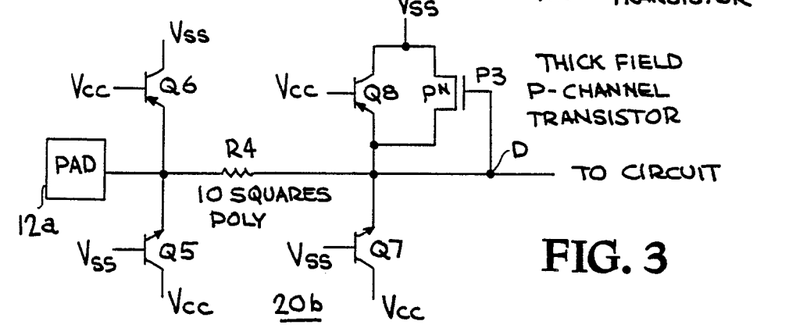
FIG. 3 is an equivalent circuit diagram of the input clamp of FIG. 1.

In FIG. 3, there is shown an equivalent circuit diagram of the input buffer protection circuit 20b of FIG. 1. The circuit 20b includes a primary clamp formed of a vertical bipolar NPN-type transistor Q5 and a lateral bipolar PNP-type transistor Q6. The transistors Q5 and Q6 are connected in the same manner as the transistors Q1 and Q2 in FIG. 2. The circuit 20b includes also a secondary clamp formed of an NPN-type bipolar transistor Q7, a PNP-type bipolar transistor Q8, and a thick P-channel field-effect transistor P3. The transistors Q7, Q8 and P3 are connected in the same way as the transistors Q3, Q4 and P1 in FIG. 2.

Figure 7:
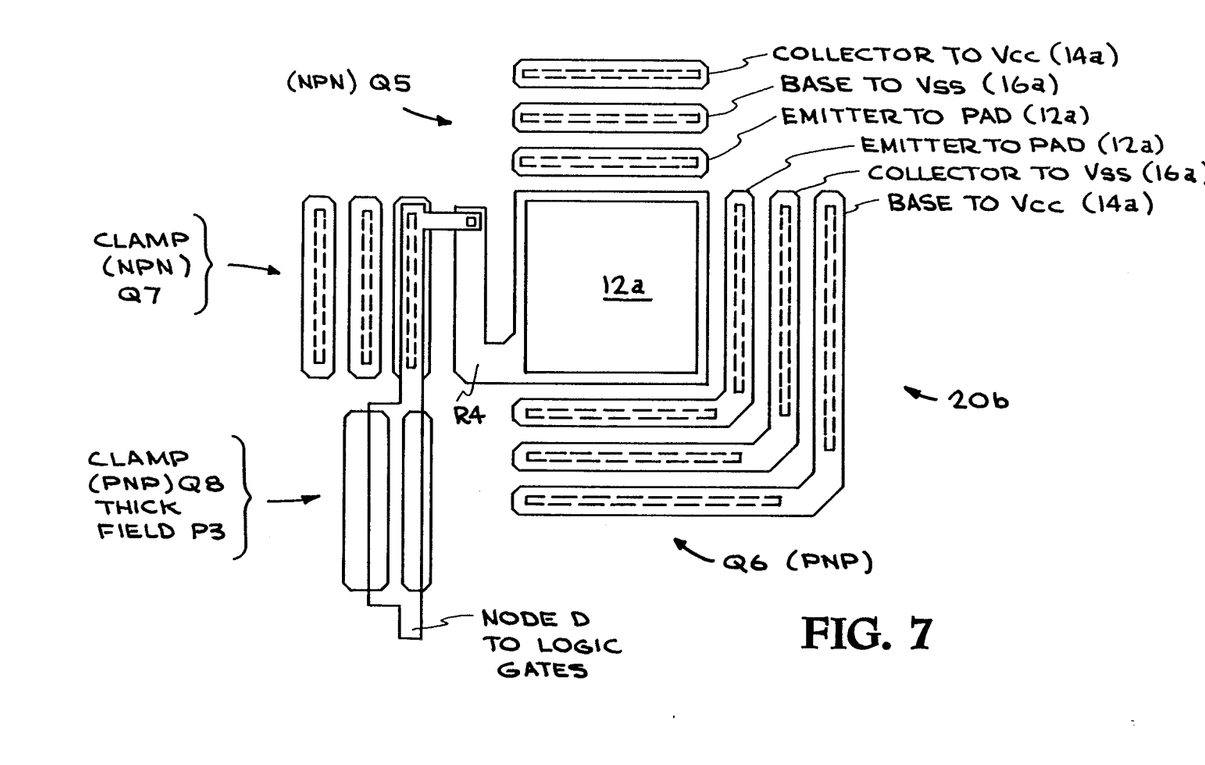

It will also be noted that a poly resistor R4 is connected between the pad 12a and a node D which is connected to the internal circuit elements of the chip 10. The secondary clamp is isolated from the high voltage developed on the pad 12a by the resistor R4. Since the operation of the circuit 20b operates in a manner similar to the circuit 20a in FIG. 2, its operation will not be repeated again. A plot of the clamp circuit 20b is shown in FIG. 7.

Figure 4:
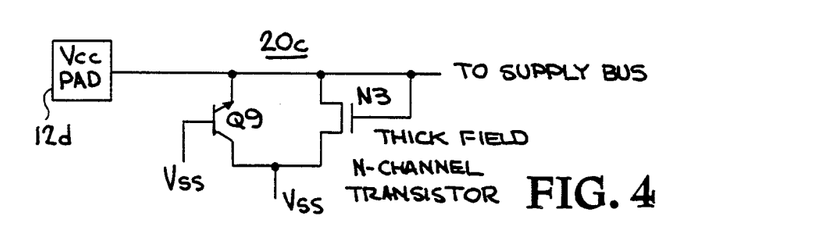
FIG. 4 is an equivalent circuit diagram of the VCC power supply clamp of FIG. 1.

In FIG. 4, there is shown an equivalent circuit diagram of the VCC pad protection circuit 20c of FIG. 1. The circuit 20c includes an NPN-type bipolar transistor Q9 and a thick N-channel transistor N3. The transistor Q9 has its base coupled to the VSS power supply layer, its emitter connected to the VCC bonding pad 12d, and its collector coupled to the VSS power supply layer. The transistor N3 has its source connected to the VSS power supply layer, its gate connected to the VCC bonding pad 12d and its drain connected to the VCC pad. The VCC pad 12d is connected to the VCC power supply layer.

Figure 8:
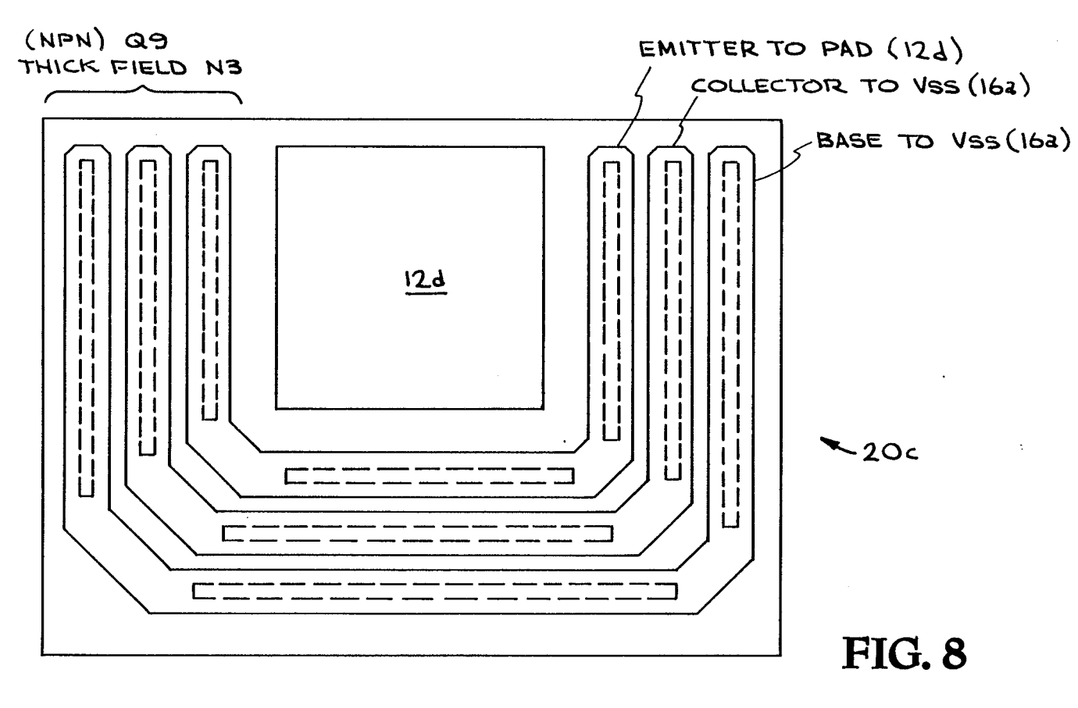

When the voltage at the VCC pad 12d goes below the supply voltage VSS, the transistor Q9 will be conductive. When the voltage at the VCC pad goes sufficiently above the supply voltage VSS, the N-channel transistor N3 will be turned on. A plot of the clamp circuit 20c is shown in FIG. 8.

Figure 5:
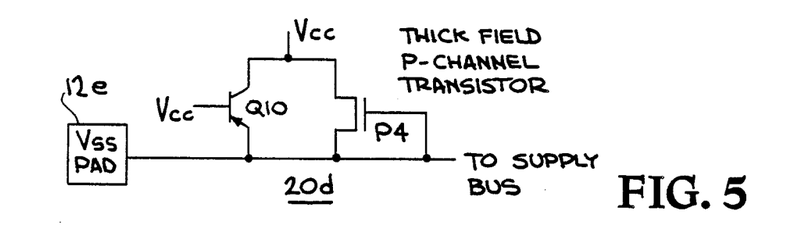
FIG. 5 is an equivalent circuit diagram of the VSS power supply clamp of FIG. 1.

In FIG. 5, there is shown an equivalent circuit of the VSS pad protection circuit 20d. The circuit 20d includes a PNP-type bipolar transistor Q10 and a thick P-channel field-effect transistor P4. The transistor Q10 has its base coupled to the VCC power supply layer, its emitter connected to the VSS bonding pad 12e, and its collector coupled also to the VCC power supply layer. The transistor P4 has its source connected to the VCC power supply layer, its gate connected to the VSS bonding pad, and its drain connected to the VSS pad. The VSS pad 12e is connected to the VSS power supply layer.

Figure 9:
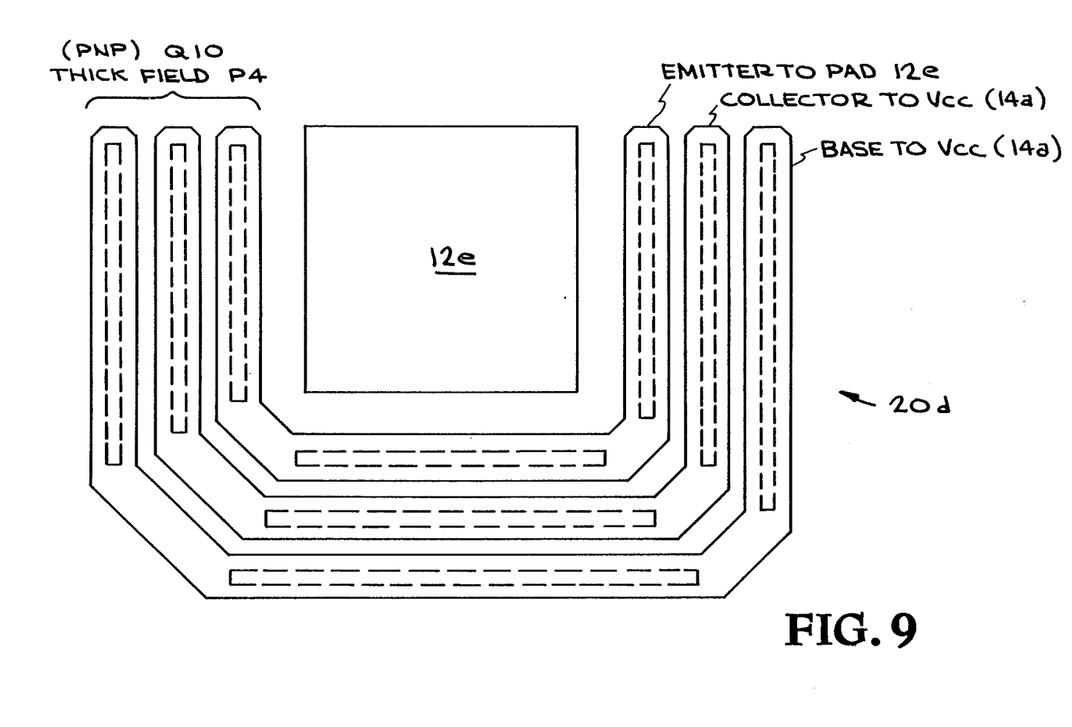

When the voltage at the VSS pad goes above the supply voltage VCC, the transistor Q10 will be conductive. When the voltage at the VSS pad goes sufficiently below the supply voltage VCC, the P-channel transistor P4 will be turned on. A plot of the clamp circuit 20d is shown in FIG. 9.

In order to explain the operation of the protection system to illustrate how it interlinks all of the bonding pads and permits the discharging of current between any pin zapped and any pin grounded, it will be assumed that the pin zapped is connected to an input bonding pad 12c with a protection circuit 20a similar to the circuit of FIG. 2 and that the pin grounded is connected to an output bonding pad 12c' with a protection circuit 20a again similar to the circuit of FIG. 2. As these two pads 12c and 12c' become ever increasingly separated in voltage, the potential on the pad 12c will eventually exceed the (assumed) floating potential of the VCC power supply layer 14a coupled to the base of the PNP-type transistor Q2. As a result, the intrinsic diode (emitter-base) within the transistor Q2 will be forward biased, thereby creating a diode clamp and forcing the VCC power supply layer 14a to follow the voltage rise on the input bonding pad 12c but lagging by one diode drop. Due to the massive area for forming this diode, the impedance is very low. As the difference in voltage between these two pads continues to rise, an avalanche or "punch-through" voltage will be reached very quickly across the collector and emitter of the NPN-type transistor Q1 whose emitter is coupled to the output bonding pad 12c'. Consequently, the transistor Q1 functions as a very low impedance bipolar clamp so as to complete the first discharge path between the two pads 12c and 12c', thereby discharging the current and preventing the charge from flowing into the internal circuit elements which could do damage thereto and destroy the same.

Also, a second parallel discharge path exists between the two pads 12c and 12c' through the VSS power supply layer 16a. Again, as the potential on the input bonding pad 12c rises it will eventually reach the "punch-through" voltage of the PNP-type transistor Q2 whose collector is coupled to the VSS power supply layer 16a. As a result, the VSS power supply layer 16a will follow and lag behind by the clamp voltage of the transistor Q2 until the layer 16a, which is coupled to the base of the NPN-type transistor Q1, reaches one forward diode drop above the potential on the output bonding pad 12c'. Then, the intrinsic diode (base-emitter) within the transistor Q1 will become forward biased and begin to conduct current so as to complete the second discharge path between the two pads 12c and 12c'. It has therefore been shown that two separate and parallel discharge paths exist between the two pads 12c and 12c', each capable of conducting significant current and having low impedance thereby limiting the voltage between the two pads.

As can be seen from the operation just described, the main responsibility of protection is placed on the primary clamps, the power supply layers, and the pads. The secondary clamps of the protection circuit are isolated by poly resistors and act independently to bleed off the remaining currents and shunts residual voltages away from sensitive junctions and oxides. Since the operation of the secondary clamps is believed to be self-explanatory to those skilled in the art, a detailed discussion thereof is unnecessary.

A similar analysis may be done with any pin zapped and any other pin grounded to show that there will always be two discharge paths through the layers 14a and 16a from the pin zapped to the pin grounded so as to prevent inadvertent damage to the chips due to an electrostatic discharge. As a result, it can be seen that there is provided protection from electrostatic charge build-up on any one of the bonding pads and a subsequent discharge through any one of the remaining bonding pads, thereby preventing inadvertent damage to the internal circuit elements on the chip.

From the foregoing detailed description, it can thus be seen that the present invention provides an improved protection system for CMOS integrated circuits to prevent inadvertent damage caused by electrostatic discharge which includes means for interlinking all of the bonding pads so that the surge on the pad having the electrostatic charge will be routed immediately via low resistance pathways to the bonding pad referenced to ground. The protection system of the present invention includes a low impedance power supply bus structure and a plurality of bipolar and MOS clamping networks.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A protection system for CMOS integrated circuits to prevent inadvertent damage caused by electrostatic discharge comprising:

a semiconductor body of a generally rectangular shape and having a central portion;

a first annular conductive layer disposed on said semiconductor body surrounding the central portion thereof;

a second annular conductive layer disposed concentrically with said first conductive layer in a spaced apart relationship and adjacent to the edges of said semiconductor body to form an area therebetween;

said first and second layers defining low impedance pathways;

a plurality of bonding pads consisting of input pads, output pads, first power supply pads, and second power supply pads disposed within the area between said first and second conductive layers;

first power supply clamping means for coupling each of the first power supply pads to said first and second layers;

second power supply clamping means for coupling each of the second power supply pads to said first and second layers;

input clamping means for coupling each of the input bonding pads to internal circuit elements formed within the central portion of the semiconductor body and for coupling each of the input bonding pads to said first and second layers;

said input clamping means including primary clamp networks each formed of a first NPN-type bipolar transistor and a first PNP-type bipolar transistor, said first NPN-type transistor having its base connected to the second conductive layer, its emitter connected to the corresponding input bonding pad, and its collector connected to the first conductive layer, said first PNP-type transistor having its base connected to the first conductive layer, its emitter connected to the corresponding input bonding pad, and its collector connected to the second conductive layer;

said input clamping means further including secondary clamp networks each formed of a second NPN-type bipolar transistor, a second PNP-type bipolar transistor, a P-channel transistor, and a resistor, said second NPN-type transistor having its base connected to the second conductive layer, its emitter connected to one end of the resistor, and its collector connected to the first conductive layer, said second PNP-type bipolar transistor having its base connected to the first conductive layer, its emitter connected to the one end of the resistor, and its collector connected to the second conductive layer, said P-channel transistor having its source connected to the second conductive layer and its gate and drain connected to the one end of the resistor, the other end of the resistor being connected to the corresponding input bonding pad;

output clamping means for coupling each of the output bonding pads to the internal circuit elements and for coupling each of the output bonding pads to said first and second layers; and said input clamping means being activated when a voltage higher than a predetermined value is received on its input bonding pad and said output clamping means being activated when its output bonding pad receives a ground potential so as to route current from said input bonding pad via the low impedance pathways to the output bonding pad for discharging of said high voltage.

2. A protection system as claimed in Claim 1, wherein said output clamping means comprises primary clamping networks formed of a first NPN-type bipolar transistor and a first PNP-type bipolar transistor.

3. A protection system as claimed in Claim 1, wherein said first power supply clamping means comprises an NPN-type bipolar transistor and an N-channel field-effect transistor.

4. A protection system as claimed in Claim 1, wherein said second power supply clamping means comprises a PNP-type bipolar transistor and a P-channel field-effect transistor.

5. A protection system as claimed in Claim 2, wherein said output clamping means further includes a secondary clamping network formed of a second NPN-type bipolar transistor, a second PNP-type bipolar transistor, and a resistor.

6. A protection system as claimed in Claim 5, wherein said secondary clamping network further includes a P-channel field-effect transistor and an N-channel field-effect transistor.

* * * * *